United States Patent
Lesea (10) Patent No.: US 7,539,926 B1
(45) Date of Patent: May 26, 2009

(54) METHOD OF CORRECTING ERRORS STORED IN A MEMORY ARRAY

(75) Inventor: Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 481 days.

(21) Appl. No.: 11/353,740

(22) Filed: Feb. 14, 2006

(51) Int. Cl.
*H03M 13/00* (2006.01)

(52) U.S. Cl. .................. 714/776; 714/758

(58) Field of Classification Search .......... 714/761, 714/752, 753, 776, 758; 711/111; 365/185.21
See application file for complete search history.

(56) References Cited

U.S. PATENT DOCUMENTS

| | | | |
|---|---|---|---|
| 5,598,424 A | | 1/1997 | Erickson et al. |
| 5,642,365 A | * | 6/1997 | Murakami et al. ........... 714/761 |
| 6,317,855 B1 | * | 11/2001 | Horibe ........................ 714/752 |
| 7,408,381 B1 | | 8/2008 | Drimer et al. |
| 2005/0283704 A1 | * | 12/2005 | Ito et al. ....................... 714/753 |
| 2007/0150650 A1 | * | 6/2007 | Hsueh .......................... 711/111 |
| 2008/0056005 A1 | * | 3/2008 | Aritome ................... 365/185.21 |

OTHER PUBLICATIONS

U.S. Appl. No. 10/971,220, filed Oct. 22, 2004, Cory et al.

* cited by examiner

*Primary Examiner*—David Ton
(74) *Attorney, Agent, or Firm*—John J. King; Thomas George (57) ABSTRACT

A method of correcting errors stored in a memory array is disclosed. According to various embodiments of the invention, the method comprises the steps of storing data in the memory array; reading back the data stored in the memory array; performing a check for errors on each frame of data in a first direction; and performing a check for errors in a second direction. The step of performing a check for errors may include a parity check or a cyclical redundancy check. Depending upon the number of errors detected in intersecting rows and columns, the state of cells of the memory array are selectively changed.

20 Claims, 9 Drawing Sheets

METHOD OF CORRECTING ERRORS STORED IN A MEMORY ARRAY

FIELD OF THE INVENTION

The present invention relates generally to devices having memory, and in particular, to a method of correcting errors stored in a memory array.

BACKGROUND OF THE INVENTION

A programmable logic device (PLD) is designed to be user-programmable so that users may implement logic designs of their choices. Programmable logic circuits of a PLD comprise gates which are configurable by a user of the circuit to implement a circuit design of the user. One type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. In some CPLDs, configuration data is stored on-chip in non-volatile memory, then downloaded to volatile memory as part of an initial configuration sequence.

Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., FLASH memory, as in some CPLDs), or in any other type of memory cell.

PLDs also have different "modes" depending on the operations being performed on them. A specific protocol allows a programmable logic device to enter into the appropriate mode. Typical PLDs have internal blocks of configuration memory which specify how each of the programmable cells will emulate the user's logic. During a "program" mode, a configuration bitstream is provided to non-volatile memory, such as a read-only memory (ROM) (e.g. a programmable ROM (PROM), an erasable PROM (EPROM), an electrically erasable PROM (EEPROM)) either external or internal to the programmable logic device. Each address is typically accessed by specifying its row and column addresses. During system power up of a "startup" mode, the configuration bits are successively loaded from the non-volatile memory into static random access memory (SRAM) configuration latches of a configuration logic block. Configuration bitstreams are typically loaded in frames, where the frames are no larger than the depth of a memory. For example, the frame would be no larger than N for an N×N memory array. At the end of this start-up phase, the PLD is now specialized to the user's design, and the PLD enters into "user" mode as part of its normal operation.

However, for the PLD to function properly, it is necessary that the data loaded into a memory is not corrupted. Accordingly, data is often read back and checked against known data to check for an error. Error checking may include both error detection and correction, or error detection without error correction. Because it is necessary to know the location of an error to correct the error, error detection techniques which only indicate the presence of errors (such as the number of errors) but not the location of errors cannot be used alone to correct errors. One conventional technique for detecting and in some cases correcting an error in a frame of data is a single error correction-double error detection ("SECDED") decoding technique. SECDED codes for encoding information, which are also known as "distance-4 Hamming codes," may be used for decoding a string of bits, where error checking or parity bits have been added to a set of data bits. A parity bit is any bit associated with one or more data bits for error checking a transmission of such data bits. Conventionally, parity bits are transmitted with data bits. For SECDED decoding, if any one bit, including data and parity bits, of a transmission is in error, the error can be detected and corrected; and if any two bits, including data bits, parity bits, or any combination of data and parity bits, of a transmission are in error, the error can be detected although it cannot be corrected.

In particular, when data is read back from the memory device, stored parity bits are compared with a newly created set of parity bits from the read data. The result of this comparison, called the syndrome, will indicate the incorrect bit position in a single data error. The syndrome is created upon a memory read and provides the ability to correct single bit errors. SECDED for N bits of data requires K parity bits to be stored with the data where $N \leq 2^K - 1 - K$. If the bits are numbered in sequence, those bit positions that represent powers of two are dedicated to parity bits. One additional parity bit detects double errors that are not correctable. This extra parity bit is an overall parity bit and is comprised by XOR-ing all the data bits and parity bits. While SECDED has been used in conventional devices to detect and possibly correct errors in the vertical direction of array, the location of multiple errors cannot be detected, and the presence of more that two errors in a frame will not be detected.

According to another error detection technique called a cyclic redundancy check (CRC), the number of errors even greater than two can be identified. CRC is used to protect blocks of data or frames. In performing a CRC, a transmitter apends an extra n-bit sequence called a Frame Check Sequence (FCS) to every frame. The FCS holds redundant information about the frame that helps the transmitter detect errors in the frame. However, a CRC provides no indication as to the location of the errors. While the detection of the number of errors provides value in determining whether errors exist, the number of errors alone generally provides little help in correcting errors. Further, as device dimensions are decreasing, the number of errors in a memory array is increasing. For example, a cosmic ray, which is generally less than a few microns, may upset as many as three memory cells in devices currently manufactured to small dimensions.

Certain applications of programmable logic devices, such as military, aerospace, and high-reliability communications, require detection of errors even when the likelihood of such an occurrence is extremely low. Furthermore, applications running in redundant systems require fast indication of a single event upset (SEU) in order to minimize the impact upon operation. In many cases, fast correction with minimal impact upon operation is also required. Even the rare SEU must be detected for some high-reliability systems so that appropriate system measures can be taken to ensure very high uptime. In certain applications, automatic correction of errors may also be a significant advantage. When processing real-time streaming data such as a video signal, for example, automatic correction of errors allows operation to continue without the need for a system reset. At a minimum, error correction allows much faster system recovery time because the FPGA does not have to be completely reconfigured, possibly causing many seconds of system downtime. With the FPGA configuration automatically corrected, a logical reset to a known system state is all that would normally be required after an error correction event.

Accordingly, there is a need for an improved method of correcting errors stored in a memory.

SUMMARY OF THE INVENTION

A method of correcting errors stored in a memory array is disclosed. According to one embodiment of the invention, the method comprises the steps of storing frames of data in the memory array; reading back the data stored in the memory array; performing a check for errors on each frame of data in a first direction; and performing a check for errors in a second direction if more than one error is detected in a given frame. The step of performing a check for errors in a second direction may include a parity check or a cyclical redundancy check. Depending upon the number of errors detected in intersecting rows and columns, the state of cells of the memory array are selectively changed.

According to an alternate embodiment, a method of correcting errors stored in a memory array comprises the steps of reading back data loaded in the memory array; performing a check of data read back in a first direction of the array using an error correction code; and performing a check of data read back in a second direction of the array using an error correction code. The method preferably comprises a step of identifying an N×N portion of the memory array having errors. The method preferably comprises a step of performing a check for errors based upon data stored on a diagonal of the memory array, and determining the location of errors of the matrix based upon a check for errors in horizontal, vertical and diagonal directions.

According to another embodiment, a method of correcting errors stored in a memory array comprises the steps of reading back data loaded in the memory array; performing a check using a cyclic redundancy check in a first direction of the array, performing a check using a cyclic redundancy check in a second direction of the array; and selectively changing the state of cells of the matrix to correct errors. The method further comprises a step of determining the size of a portion of the memory array having errors, and determining the location of errors depending upon the size of the array having errors.

DETAILED DESCRIPTION OF THE DRAWINGS

Figure 1:
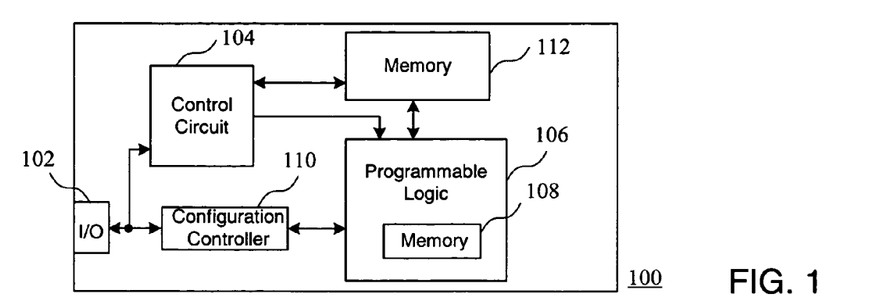
FIG. 1 is a block diagram of a circuit for correcting errors stored in a memory array according to an embodiment the present invention.

Turning first to FIG. 1, a block diagram of a circuit for correcting errors stored in a memory array according to an embodiment the present invention is shown. The circuit of FIG. 1 preferably comprises an integrated circuit 100 having an input/output port 102 coupled to a control circuit 104 and a programmable logic circuit 106. The programmable logic circuit comprises gates which are configurable by a user of the circuit to implement a circuit design of the user. The circuits implemented in the programmable logic circuit are implemented according to configuration data downloaded to the integrated circuit 100. As will be described in more detail below, the programmable logic circuit comprises configuration memory 108. Generally, configuration memory 108 comprises memory cells for configuring the programmable logic based upon the configuration data. Although a single programmable logic circuit 106 is shown, it should be understood that the programmable logic circuit 106 may comprise a plurality of programmable logic circuits. Similarly, although a single configuration memory 108 is shown, a given programmable logic circuit may comprise a plurality of memory blocks having memory cells. Also, configuration memory 108 may be either volatile memory or non-volatile memory, or a programmable logic circuit may include both volatile and non-volatile memory. Finally, the circuit may comprise a memory 110, external to the programmable logic circuit, which may either be volatile or non-volatile memory. The circuit of FIG. 1 may be any device having programmable logic, such as a programmable logic device described above, or any integrated circuit having programmable logic, such as an application-specific integrated circuit (ASIC) having a portion of circuits which is programmable. According to one aspect of the embodiment of FIG. 1, the configuration controller 110 enables correcting errors in data stored in a memory of the PLD, as will be described in more detail below.

Figure 2:
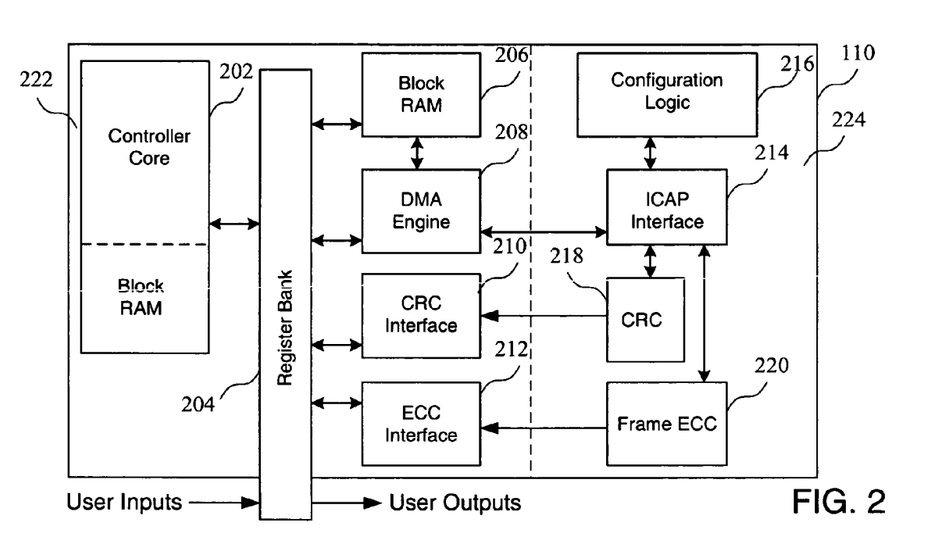
FIG. 2 is a block diagram of configuration controller 110 of FIG. 1 according to an embodiment of the present invention.

Turning now to FIG. 2, a block diagram of configuration controller 110 of FIG. 1 according to an embodiment of the present invention is shown. The configuration controller 110 comprises a controller core 202 having a block RAM (BRAM) coupled to a register bank 204. The controller core 110 is used to perform continuous read-back of the device configuration contents of a memory. A separate BRAM 206 is coupled to the register bank 204 and a direct memory access (DMA) engine 208. The register bank is also coupled to a CRC Interface 210 and an ECC interface 212. The DMA engine is coupled to an internal configuration access port (ICAP) interface 214 which interfaces with a configuration logic block 216 to read back data stored in the configuration logic block. The ICAP interface also provides an interface to a CRC module 218 enabling a CRC of data and a Frame ECC module enabling ECC error detection as will be described in more detail below.

The ICAP interface provides both the read back necessary to stimulate the Frame ECC interface, as well as the means to read, repair, and write-back the correct data for a frame which was determined to be erroneous. As each frame is read, the configuration controller 110 keeps track of the frame address and stores the frame data using the ICAP interface. In the event of an error, the controller uses the output of the Frame ECC interface to determine whether the error was single-bit or double-bit. In the event of a single-bit error, the syndrome can be used to repair the stored frame. The repaired frame can then be written back through ICAP, effectively correcting the error.

In operation, the control core initiates read-back and monitors the Frame ECC interface for detection and also manages the read modify-write flow required to flip a bit back to its original state when a correction mode is enabled. BRAM is required for the core to control the ICAP interface and store configuration frames for correction. The register bank provides an interface between the configuration controller and the rest of the module. It allows the core to access module inputs and outputs, as well as control the DMA engine 208 that is responsible for managing the flow of configuration data between the block RAM and the ICAP interface. The ICAP interface may be a hard-wired module, as opposed to a module implemented in configurable logic of a programmable logic device, that has direct access to the device configuration logic and supports all the normal FPGA configuration operations, such as write, read back, etc. The register bank provides control core access to the CRC interface and the CRC. The register bank also provides control core access to the ECC interface and the Frame ECC core. The circuits may be implemented in portions of the PLD comprising a configurable portion 222 and a hard-wired portion 224, for example.

Data may be read back at a given rate, such as a rate of 68 to 800 complete device scans per second, depending on the size of the device. As each frame of device configuration is read, the CRC or ECC interface is monitored depending upon the methods of detecting errors. In the event of an error, the controller core provides indication to the user and determines what, if any, action should be taken in response. This allows extremely fast detection of errors anywhere in the configuration address memory even if the errors are going to be corrected. The read back of data is preferably continuous.

Figure 3:
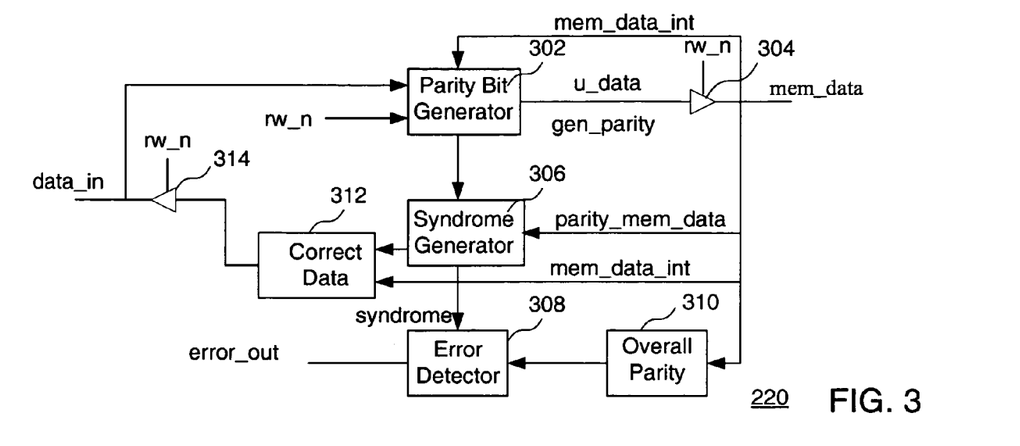
FIG. 3 is a block diagram of an error correction code circuit according to an embodiment of the present invention.

Turning now to FIG. 3, a block diagram of an error correction code circuit according to an embodiment of the present invention is shown. Detection and identification of errors may be performed utilizing the Frame ECC block 220. Determining the location of an erroneous frame in the configuration memory and repairing it is achieved by way of the ICAP interface. The Frame ECC block uses SECDED parity values based on the frame data. A parity code is calculated for, and embedded into, each frame of configuration memory during bitstream generation. During read-back, the logic of the Frame ECC block 220 calculates a syndrome value using all the bits in the frame, including the ECC bits. The syndrome value indicates whether an error occurred, and either the location of the error within the frame for single bit errors, or an indication that a non-correctable double-bit error has occurred.

The Frame ECC block consists of a configuration controller data bus, data_in, the read/write control signal, rw_n, and the error flag signal, error_out. A memory component interface for reading data from or writing data to the configuration memory of the configurable logic block consists of the memory data bus, mem_data. The rw_n control signal from the configuration controller switches the PLD between read and write cycles. For example, the rw_n signal may be equal to "1" for a read cycle and equal to "0" for a write cycle. The parity bit generator 302 creates the parity bits to store with the data from the controller core 202 during a write cycle. In a read cycle, the parity bit generator is also responsible for creating the parity data input to the syndrome generator 306 based upon mem_data_int read from the memory. The syndrome generator 306 generates a syndrome value based upon the output of the parity_mem_data and the output of the parity bit generator. The parity bit generator creates the parity bits with the data word stored in memory. An error detector 308 generates the error_out flag based on the syndrome and the overall parity created from the data in memory and the output of the overall parity block 310. Correct data is output by a Correct Data block 312 to correct the data in the memory. An example of the generation of an error signal using ECC can be found in U.S. patent application Ser. No. 10/971,220, entitled "ERROR CHECKING PARITY AND SYNDROME OF A BLOCK OF DATA WITH RELOCATED PARITY BITS", filed on Oct. 22, 2004 by the assignee of the present application, the entire application of which is incorporated by reference.

Figure 4:
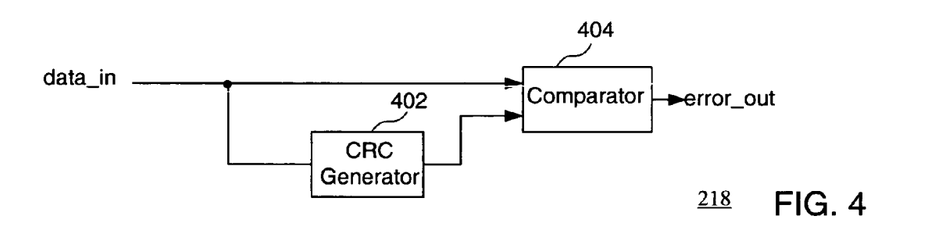
FIG. 4 is a block diagram of a cyclic redundancy code circuit according to an embodiment of the present invention.

Turning now to FIG. 4, a block diagram of a cyclic redundancy code circuit according to an embodiment of the present invention is shown. In particular, a CRC generator 402 receives the data_in signal, and generates a CRC value. A comparator coupled to the output of the CRC generator compares the CRC value generated by the CRC generator with the CRC value stored in the data_in signal. An error_out signal is generated by the comparator to indicate an error. The generation of CRC values and error outputs is well known in the art. An example of a CRC generator is described in U.S. Pat. No. 5,598,424, granted on Jan. 28, 1997 to the assignee of the present application, the entire patent of which is also incorporated by reference.

Figure 5:
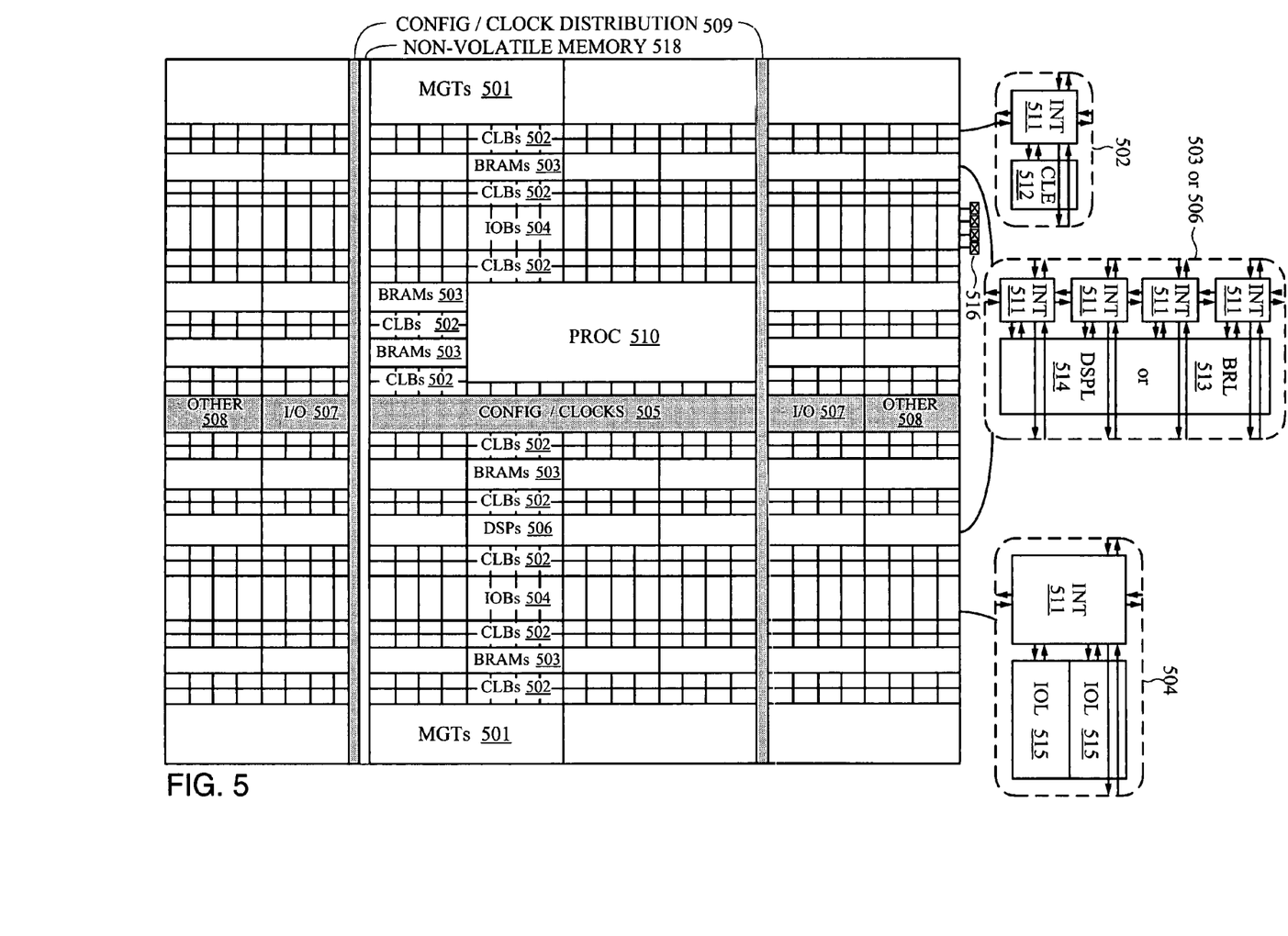
FIG. 5 is a block diagram of a programmable logic device according to an embodiment of the present invention.

Turning now to FIG. 5, a block diagram of a programmable logic device according to an embodiment of the present invention is shown. In particular, advanced FPGAs can include several different types of programmable logic blocks in the array. For example, FIG. 5 illustrates an FPGA architecture 100 that includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA.

The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An IOB 504 can include, for example, two instances of an input/output logic element (IOL 515) in addition to one instance of the programmable interconnect element (INT 511). As will be clear to those of skill in the art, the actual I/O pads connected, for example, to the I/O logic element 515 are manufactured using metal layered above the various illustrated logic blocks, and typically are not confined to the area of the input/output logic element 515.

In the pictured embodiment, a columnar area near the center of the die (shown shaded in FIG. 5) is used for configuration, clock, and other control logic. Horizontal areas 109 extending from this column are used to distribute the clocks and configuration signals across the breadth of the FPGA. Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs. The circuits of FIGS. 1-4 may be implemented in the various elements of the FPGA of FIG. 5 or some other suitable programmable logic device or integrated circuit having programmable logic and configuration data which may be read back.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic. Similarly the circuits and methods of the present invention could be implemented in any device, including any type of programmable logic device, having memory.

Figure 6:
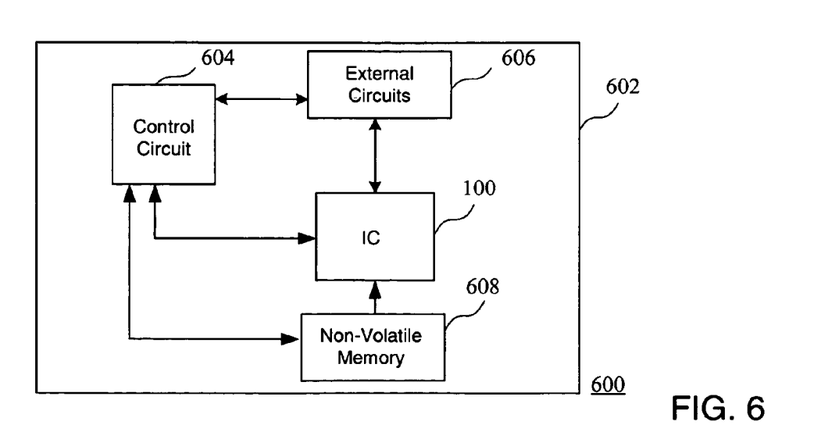
FIG. 6 is a block diagram of a circuit having an integrated circuit 100 comprising the circuit of FIG. 1 according to an embodiment the present invention.

Turning now to FIG. 6, a block diagram of a circuit having an integrated circuit comprising the circuit of FIG. 1 according to an embodiment the present invention is shown. The circuit 600 comprises a circuit board 602 having a control circuit 604. The control circuit 604 may be, for example, a microprocessor or other integrated circuit for controlling external circuits 606, integrated circuit 100, and a non-volatile memory 608. Depending upon the type of device employing programmable logic which is used, the control circuit 604 may be implemented on the integrated circuit 100. By allowing users to read back data from memory cells, it is possible to correct data of a programmable logic device of the integrated circuit 100 as described above. That is, board-level devices external to the integrated circuit 100, such as external circuits 606, may enable an external read back and correction of data stored in a memory of the integrated circuit.

Figure 7:
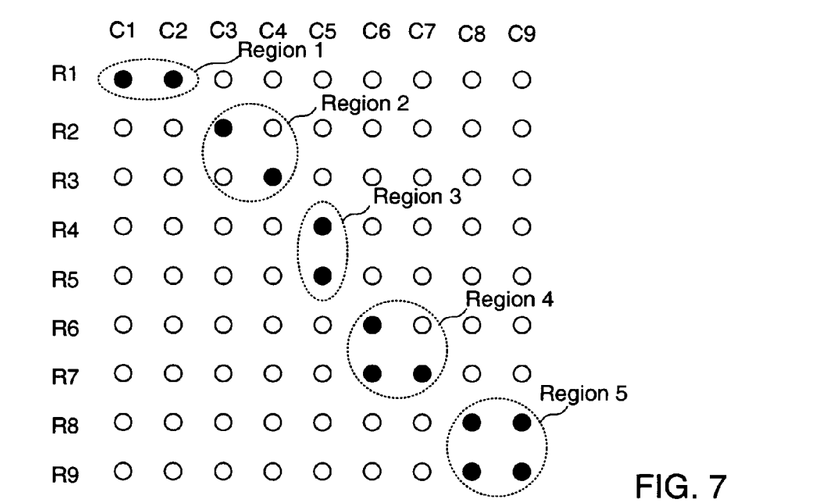
FIG. 7 is a memory array showing regions having errors in at most a 2×2 cell portion of the memory array and the read back of data in two dimensions.

Turning now to FIG. 7, a memory array shows regions having errors in at most a 2×2 cell portion of the memory array, and the read back of data in two dimensions is shown. While multiple regions having errors are shown in a single array in FIG. 7, it should be understood that the multiple regions are shown for convenience, and only an array having a single region of errors can be corrected according to the embodiments of the present invention. The errors shown in shaded circles of the various regions are shown by way of example for describing various techniques for identifying the location of the errors or a method of correcting the errors. A frame of data may comprise up to a column of data. Region 1 shows errors in two adjacent columns of a row. However, because there is only a single error, both the presence and the location of the error may be detected using conventional techniques, such as SECDED of data in the vertical direction. Similarly, the errors of Region 2 may also be detected and corrected using conventional SECDED techniques. However, while the presence of the errors of Region 3 may be detected using SECDED, the locations of the errors cannot be detected, and therefore the errors cannot be corrected using conventional techniques. That is, while it may be possible to detect the presence of two errors of column C5, there is no way to determine the location of the errors.

According to one embodiment of the invention, the errors of Region 3 may be detected by performing an error detection technique in a second direction. While the error detection technique may be a technique for detecting the location of an error, such as ECC, only the presence of an error is necessary. That is, the intersection of two errors in the column C5 with two rows identified as having errors will provide the location of the two errors, enabling correction of the two errors. For example, as shown in Region 4, the location of the errors in column C6 may not be detected using SECDED. However, because the presence of two errors may by detected using SECDED, the location of the errors may be detected by determining rows which have errors. Finally, in the event that two columns are determined to each have two errors, the location of the rows having errors will indicate that there are errors in all of the cells of the intersection of the columns and row, as shown for example in Region 5.

The techniques for detecting and correcting the presence of errors described in reference to FIG. 7 may be used when it is believed that the probability of errors in a matrix greater that a 2×2 matrix is minimal. For example, the physical dimensions of a memory cell may be such that errors occupying a larger matrix are highly improbable. Also, while techniques for determining the locations of errors, such as SECDED, may be used, techniques such as CRC which determine the number of errors in a row or cell may also be used. That is, because the error detection technique is operated based upon data read back in two directions, the locations of the errors may be determined based upon the intersection of the rows and columns detected as having errors (even if the specific location of the errors is not detected by a given error detection technique). However, if a user must protect against errors in a larger matrix, additional measures may be taken according to alternate embodiments of the present invention.

Figure 8:
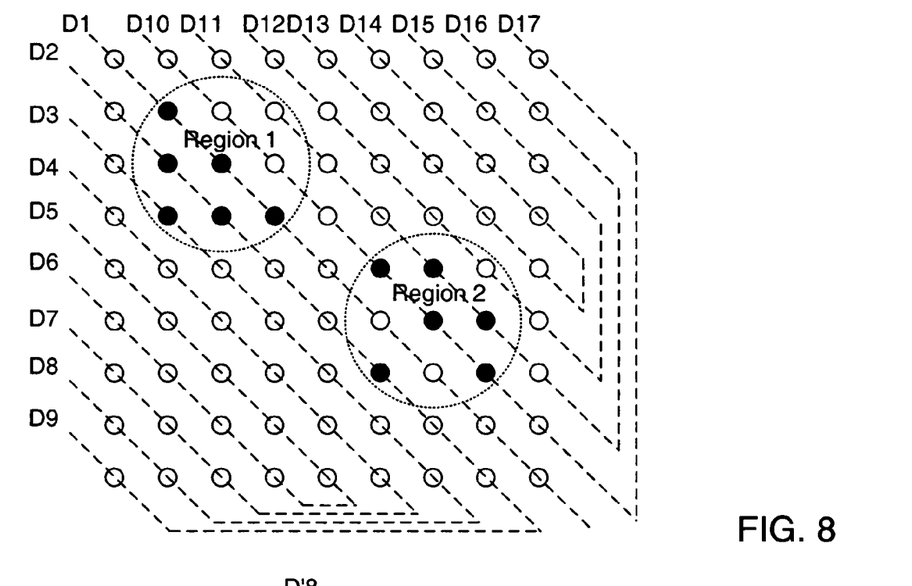
FIG. 8 is a memory array showing regions having errors in at most a 3×3 cell portion of the memory array and the read back of data in 3 dimensions.

Turning now to FIG. 8, a memory array shows regions having errors in at most a 3×3 cell portion of the memory array and the read back of data in 3 dimensions. According to the embodiment of FIG. 8, a third orthogonal direction is defined, where an error detection technique is also used to read back data in a third direction, enabling the determination of errors in a 3×3 matrix of memory cells. The size of the matrix having errors may first be determined using an error detection technique in two directions, such as rows and columns. In addition to the rows and columns defined in FIG. 7, a third direction is selected. For example, data is read back from cells in diagonals shown here as a diagonal at a 45 degree angle. The location of the diagonals may be selected so that each diagonal includes the same number of cells as in the rows and columns. Data read back from the cells in the diagonals D1-D17 can be used with the data read back from the columns and rows to enable determining the location of errors in the 3×3 matrix. As can be seen in FIG. 8, because the diagonals define at least three equations in addition to three equations for each of the three rows and three columns of a 3×3 matrix, nine equations can be used to determine the presence of errors in the 3×3 matrix. Because it is necessary to determine the presence of three errors in a given direction, a technique such as CRC is necessary to determine that a set of cells in a row, column or diagonal has three errors.

However, it may be possible to reduce the size of the matrix by performing an error detection technique which will identify the location the errors in order to eliminate some errors and reduce the size of the matrix having errors to a smaller matrix. For example, a 3×3 matrix may be reduced to a 2×2 matrix by eliminating a row and a column of the matrix. After initially determining the size of the array, it may be beneficial to determine whether any single errors can be eliminated in the rows or columns. As shown in region one of FIG. 8, the single error in R4, C4 may be corrected by performing a CRC of the columns. Similarly, the single error in R2, C2 may be corrected by performing a CRC of the rows. As can be seen, a 2×2 matrix would be left after the corrections, which may be corrected according to the techniques described above in reference to FIG. 7. It should also be noted that single errors may also be detected and corrected in a diagonal direction which is defined. The detection of errors in diagonals may enable reducing a 3×3 matrix to a 2×2 matrix, or eliminate multiple errors depending upon the location of the diagonal in the 3×3 matrix, as will be described in more detail below.

As shown in Region 2 of FIG. 8, the number of errors (less than 3) my be used to determine the location of an error in a 3×3 matrix based upon the number of cells of the 3×3 matrix which happen to fall in the diagonal. As can be seen, the diagonals will have either one, two or three cells in a 3×3 matrix. According, the presence of an error in a diagonal having one cell may be used to determine the location of an error. That is, because the errors in the array are limited to the 3×3 matrix, the presence of a single error in a diagonal only having one cell in the 3×3 matrix would indicate that the one cell contains the error. Similarly, the location of two errors may be determined in a diagonal having two errors, while the location of three errors may be determined in the row of the 3×3 matrix having 3 cells. However, in any situation where the error are identified in a 3×3 matrix, the location of the errors may be determined by using nine equations associated with the number of errors in the rows, columns or diagonals. That is, even if certain errors may be eliminated and the size of the matrix may be reduced, it is always possible to determine the locations of the errors in the 3×3 matrix by using nine equations related to three directions associated with the matrix.

Figure 9:
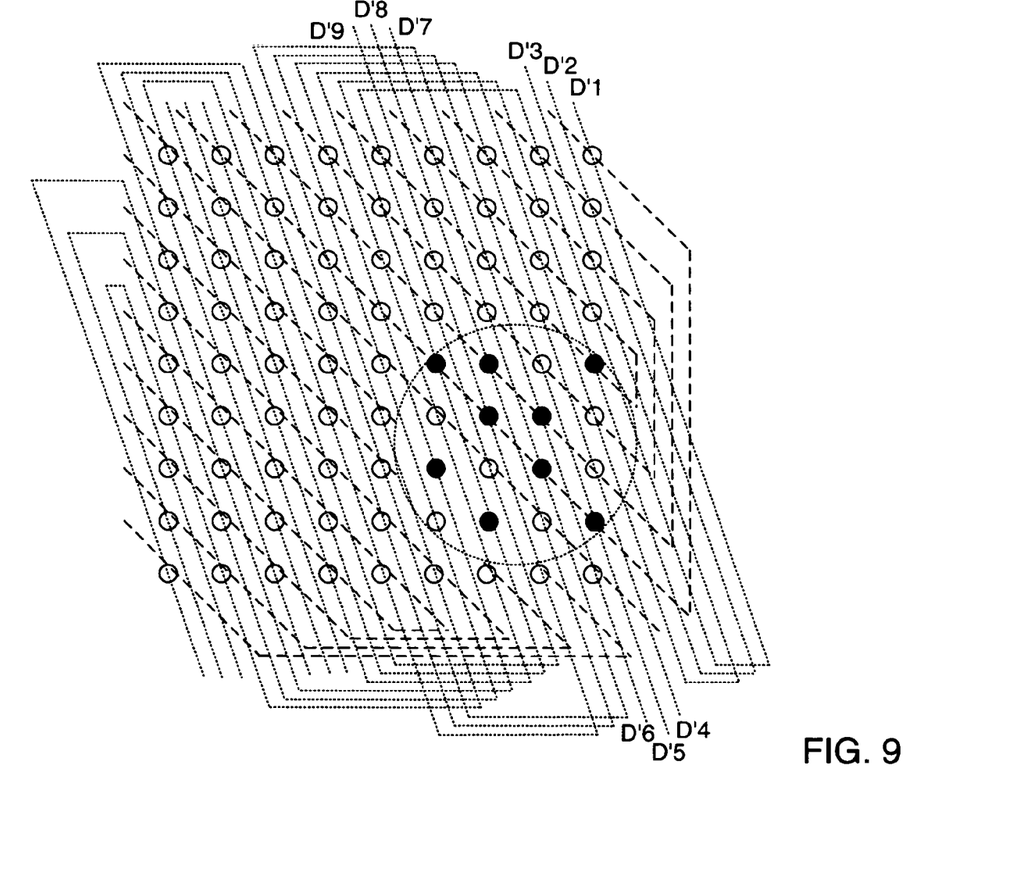
FIG. 9 is a memory array showing regions having errors in at most a 4×4 cell portion of the memory array and the read back of data in 4 dimensions according to an embodiment of the present invention.

Turning now to FIG. 9, a memory array shows regions having errors in at most a 4×4 cell portion of the memory array and the read back of data in 4 dimensions according to an embodiment of the present invention. In addition to the rows, columns, and diagonals described in FIG. 8, another set of diagonals, identified as D'1-D'9, is established to provide additional data for identifying the location of errors in a cell of the larger 4×4 array. The various techniques for eliminating errors in cells where the location of the errors may be identified may be employed as described above in reference to the 3×3 matrix. Alternatively, the errors in the 16 cells of the 4×4 matrix may be eliminated by 16 equations defining the number of errors in 16 of the rows, columns or diagonals. While an example of a 4×4 matrix associated with 4 dimensions is shown, it will be understood that errors in a matrix of any size may be identified by establishing orthogonal directions including various cells to create an adequate number of equations to identify errors in a corresponding number of cells.

Figure 10:
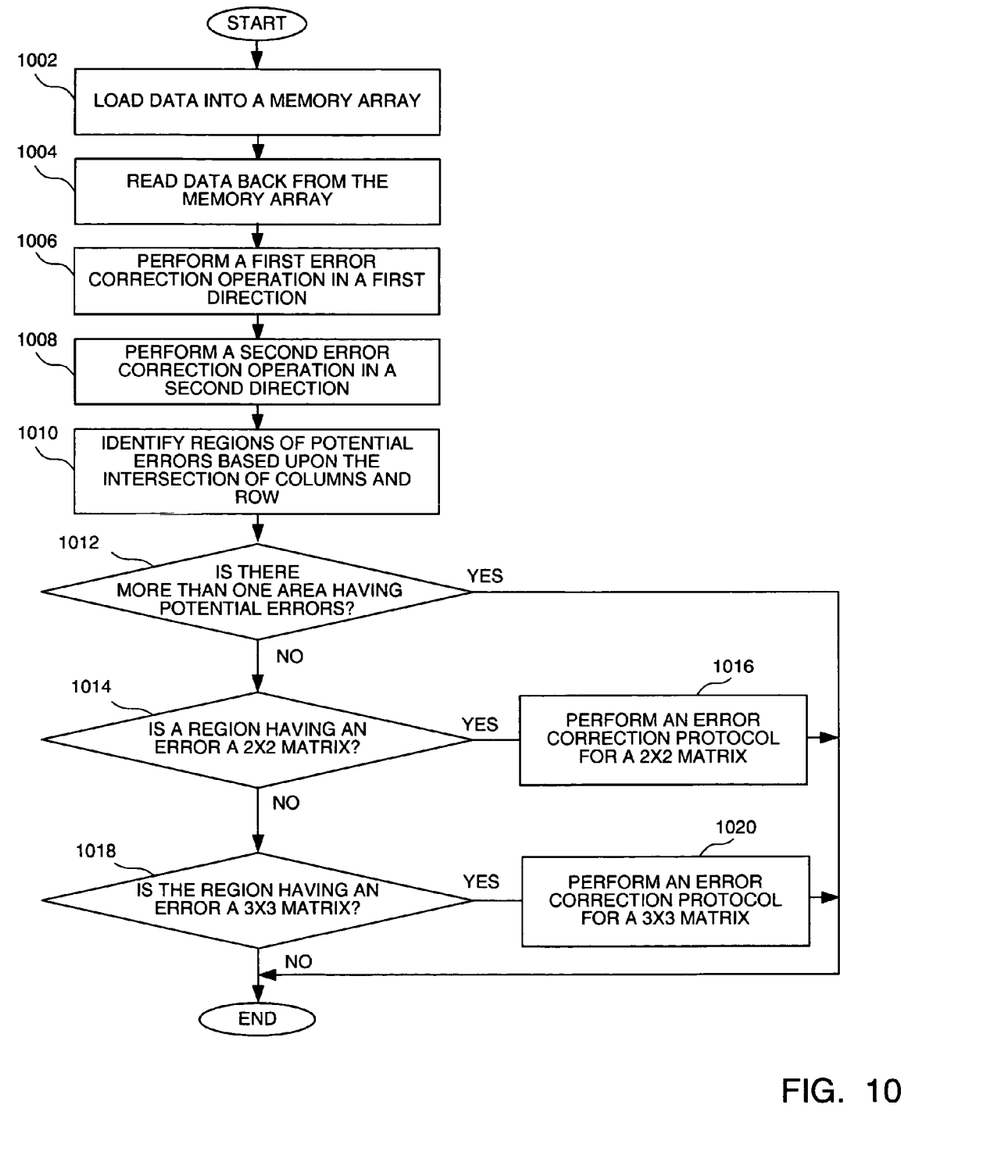
FIG. 10 is a flow chart showing a method of correcting errors stored in a memory array according to an embodiment of the present invention.

Turning now to FIG. 10, a flow chart shows a method of correcting errors stored in a memory array according to an embodiment of the present invention. The method of FIG. 10, as well as the follow methods of FIGS. 11-15, may be employed for the circuits of the programmable logic devices described above, or any other circuit having memory arrays from which data may be read back. Data is loaded into a memory array at a step 1002. The data is then read back from the memory array at a step 1004. A first error correction operation is performed in a first direction at a step 1006. A second error correction operation is performed in a second direction at a step 1008. A region of potential errors is identified based upon the intersection of columns and row at a step 1010. It is then determined if more than one area having potential errors is detected at a step 1012. If so, the procedure for correcting errors is terminated. If not, it is then determined if the region having errors is a 2×2 matrix at a step 1014. If so, a procedure for correcting a 2×2 matrix is employed at a step 1016. If not, it is determined if the region having errors is a 3×3 matrix at a step 1018. If so, a procedure for correcting a 3×3 matrix is employed at a step 1020. Otherwise, the process is ended.

Figure 11:
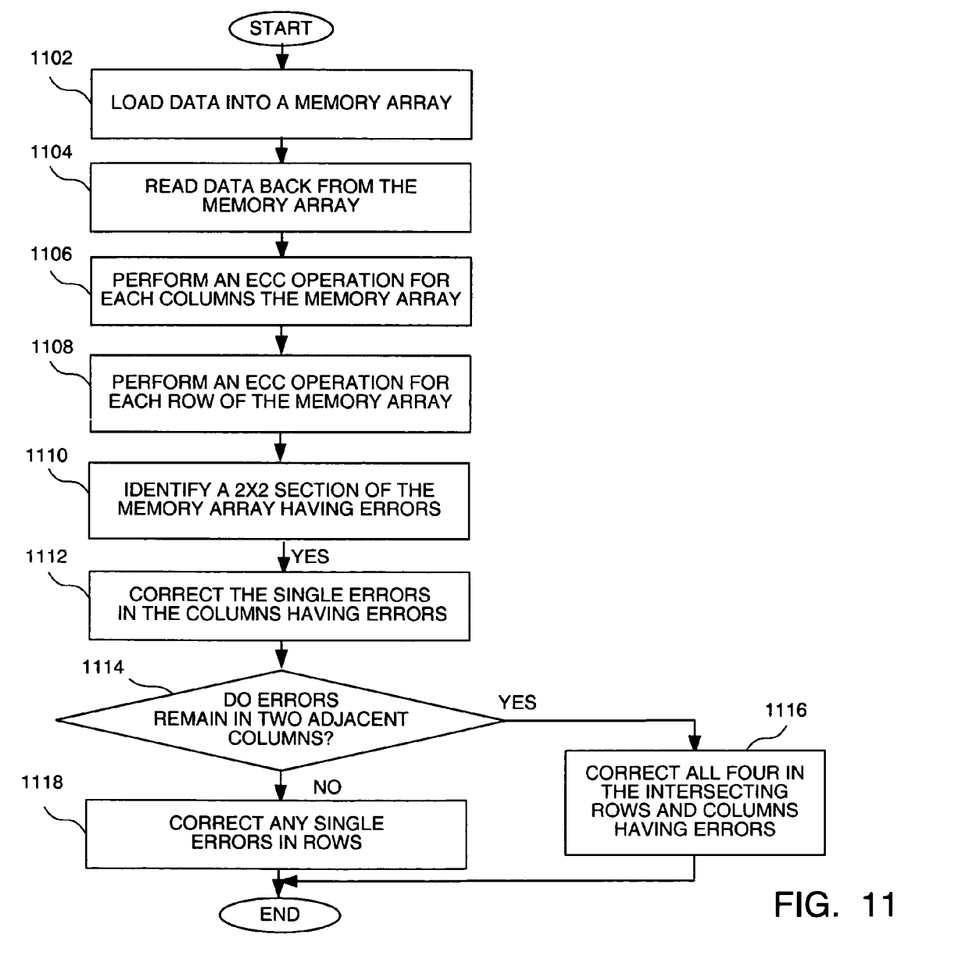
FIG. 11 is a flow chart showing a method of analyzing portions of an array for correcting errors stored in a memory array according to an embodiment of the present invention.

Turning now to FIG. 11, a flow chart shows a method of analyzing portions of an array for correcting errors stored in a memory array according to an embodiment of the present invention. Data is loaded into a memory array at a step 1102. Data is then read back from the memory array at a step 1104. An ECC operation is performed for each column of the memory array at a step 1106. An ECC operation is also performed for each row of the memory array at a step 1108. A 2×2 matrix having errors is then identified at a step 1110. All single errors in the columns are then corrected at a step 1112. It is then determined if errors remain in two adjacent columns at a step 1114. If so, all four cells of the 2×2 matrix are corrected at a step 1116. Otherwise, any single errors in rows are corrected at a step 1118.

Figure 12:
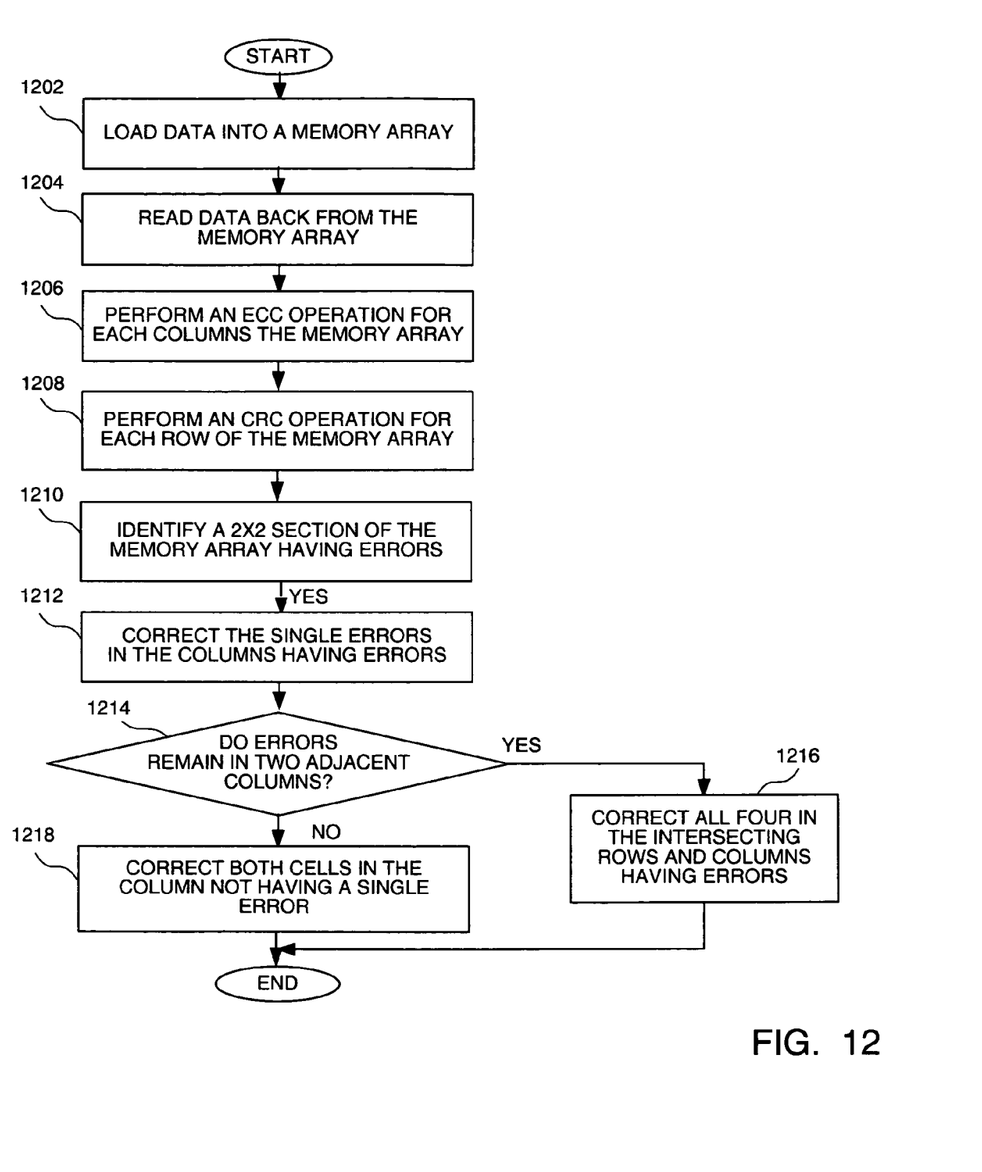
FIG. 12 is a flow chart showing a method of correcting errors in a 2×2 portion of a memory array according to an embodiment of the present invention.

Turning now to FIG. 12, a flow chart shows a method of correcting errors in a 2×2 portion of a memory array according to an embodiment of the present invention. Data is loaded into memory array at a step 1202. The data is then read back from the memory array at a step 1204. An ECC operation is then performed on the columns the memory array at a step 1206. A CRC operation is then performed on each row of the memory array at a step 1208. A 2×2 matrix having errors is then identified at a step 1210. All single errors in the columns are then corrected at a step 1212. It is then determined if errors are detected in two adjacent columns at a step 1214. If so, the state of all four cells is changed in both adjacent rows having errors at a step 1216. Otherwise, both cells in the column not having a single error are changed at a step 1218.

Figure 13:
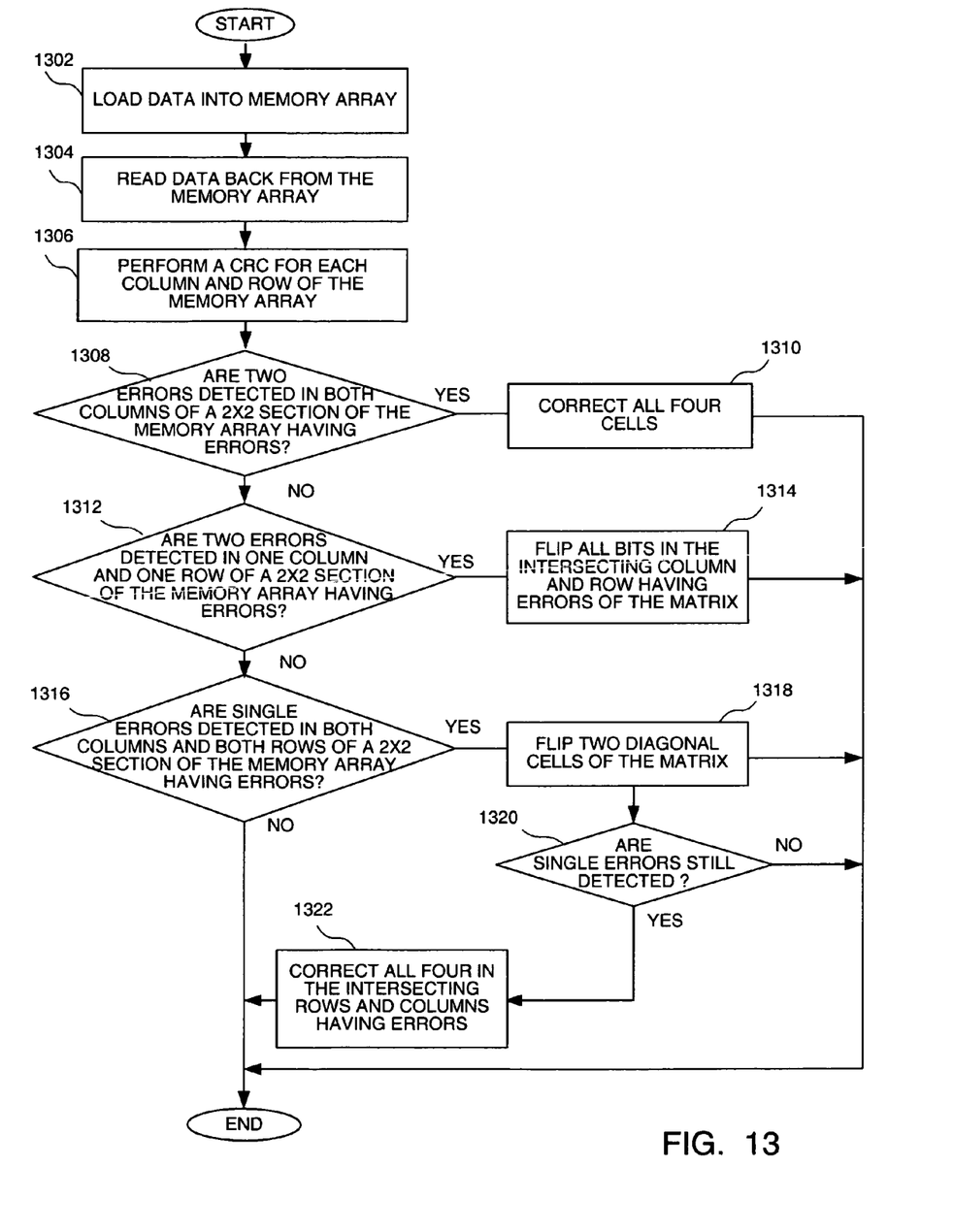
FIG. 13 is a flow chart showing a method of correcting errors in a 2×2 portion of a memory array according to an alternate embodiment of the present invention.

Turning now to FIG. 13, a flow chart shows a method of correcting errors in a 2×2 portion of a memory array according to an alternate embodiment of the present invention. Data is loaded into memory array at a step 1302. The data is then read back from the memory array at a step 1304. A CRC is performed for each column and each row of the memory array at a step 1306. It is then determined if two errors are detected in both columns of a 2×2 section of the memory array having errors at a step 1308. If so, all four cells are corrected at a step 1310. It is then determined if two errors are detected in one column and one row of a 2×2 section of the memory array having errors at a step 1312. If so, all bits in the intersecting row and column are corrected at a step 1314. It is then determined if a single error is detected in both columns and both row of a 2×2 section of the memory array having errors at a step 1316. If so, two diagonal cells of the matrix are switched at a step 1318. It is then determined if errors are still detected at a step 1320. If so, all four cells are corrected in the intersecting rows and columns having errors.

Figure 14:
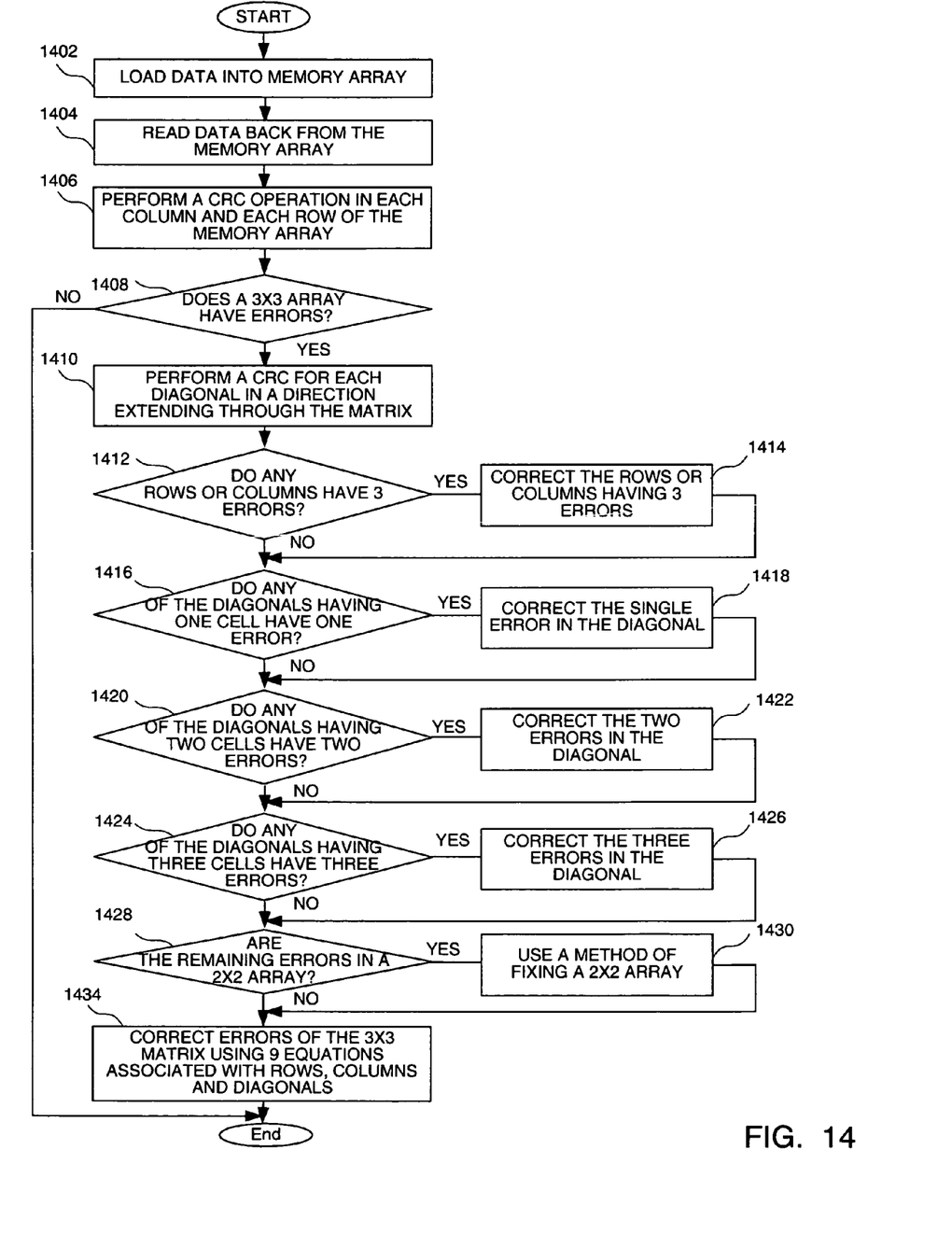
FIG. 14 is a flow chart showing a method of correcting errors in a 3×3 portion of a memory array according to an embodiment the present invention.

Turning now to FIG. 14 is a flow chart shows a method of correcting errors in a 3×3 portion of a memory array according to an embodiment the present invention. Data is loaded into memory array at a step 1402. The data is then read back from the memory array at a step 1404. A CRC is performed on each column and each row of the memory array at a step 1406. It is then determined if errors in the cell are limited to a 3×3 array at a step 1408. If not, the error correction procedure is terminated. Otherwise, a CRC performed for each diagonal in a direction extending through the matrix at a step 1410. It is then determined if any row or column has 3 errors at a step 1412. If so, the rows or columns having 3 errors are corrected at a step 1414. It is then determined if any diagonal having one cell have one error at a step 1416. If so, the single error in the diagonal is corrected at a step 1418. It is then determined if any diagonal having two cells has two errors at a step 1420. If so, the two errors in the diagonal are corrected at a step 1422. It is then determined if any diagonal having three cells has three errors at a step 1424. If so, the three errors in the diagonal are corrected at a step 1426. It is then determined if the remaining errors are in a 2×2 matrix at a step 1428. If so, the errors may be corrected using a method of correcting errors in a 2×2 array at a step 1430. Finally, if errors still remain, the errors in the 9 possible locations of the 3×3 matrix are corrected using 9 equations associated with the 3 rows, 3 columns and 5 diagonals at a step 1434. It should be noted that any errors corrected during steps 1414, 1418, 1422, 1426 and 1430 would take into account a previously corrected error and not change a bit that had already been corrected in another step.

It can therefore be appreciated that the new and novel method of correcting errors stored in a memory array has been described. It will be appreciated by those skilled in the art that numerous alternatives and equivalents will be seen to exist which incorporate the disclosed invention. For example, methods describing the detection of errors based upon specific error detection techniques for columns and rows could also be applied to rows and columns, respectively. As a result, the invention is not to be limited by the foregoing embodiments, but only by the following claims.

The invention claimed is:

1. A method of correcting errors stored in a memory array, said method comprising the steps of:
    storing frames of data in said memory array;
    reading back said data stored in said memory array;
    performing a check for errors on each frame of data in a first direction; and
    performing a check for errors of data in a second direction if more than one error is detected in a given frame.

2. The method of claim 1 further comprising a step of detecting errors associated with two intersecting rows and two intersecting columns.

3. The method of claim 2 further comprising a step of switching any single errors detected in said step of performing a check for errors on each frame of data in said first direction, wherein said step of performing a check for errors on each frame of data in a first direction comprises a parity check.

4. The method of claim 3 further comprising a step of switching errors detected in said step of performing checks for errors in a second direction.

5. The method of claim 4 further comprising a step of switching the state of both cells of a column and two intersecting rows if more that one error is detected in the column.

6. The method of claim 1 wherein said step of performing a check for errors in a second direction comprises a step of performing a check for errors using an error correction code.

7. The method of claim 1 wherein said step of performing a check for errors in a second direction comprises a step of performing a check for errors using a cyclic redundancy check.

8. A method of correcting errors stored in a memory array, said method comprising the steps of:
    reading back frames of data loaded in said memory array;
    performing a check of the frames of data read back in a first direction of said array using an error correction code; and
    performing a check of data read back in a second direction of said array using an error correction code.

9. The method of claim 8 further comprising a step of identifying an N×N portion of said memory array having errors.

10. The method of claim 9 further comprising a step of changing the state of N cells in a column of the N×N portion if N errors are detecting.

11. The method of claim 9 further comprising a step of changing all four bits if there are no single errors in a 2×2 portion of memory array having errors.

12. The method of claim 8 further comprising a step of determining if three intersecting rows and columns have errors.

13. The method of claim 12 further comprising a step of performing a check for errors based upon data stored on a diagonal of said memory array.

14. The method of claim 13 further comprising a step of determining the location of errors of the matrix based upon a check for errors in each of the horizontal, vertical and diagonal directions.

15. A method of correcting errors stored in a memory array, said method comprising the steps of:
    reading back data loaded in said memory array;
    performing a check using a cyclic redundancy check in a first direction of said array
    performing a check using a cyclic redundancy check in a second direction of said array; and
    selectively changing the state of cells of a matrix to correct errors.

16. The method of claim 15 further comprising a step of changing the state of all four cells if all double errors are detected in a 2×2 portion of the matrix.

17. The method of claim 16 further comprising a step of the changing the state of diagonal corners if no double errors are detected in a 2×2 portion of the matrix.

18. The method of claim 17 further comprising a step of changing the state of all four cells of the 2×2 portion of the matrix of the errors are not corrected by changing the state of diagonal corners.

19. The method of claim 15 further comprising a step of performing a check using a cyclic redundancy check in a diagonal direction if a 3×3 portion of the matrix comprises errors.

20. The method of claim 19 further comprising a step of changing the state of cells based upon the number of errors detected in a given diagonal.

* * * * *